United States Patent [19]
Yamaguchi et al.

[11] Patent Number: 5,894,421
[45] Date of Patent: Apr. 13, 1999

[54] METHOD AND APPARATUS FOR CALCULATING SLEW RATES AND SIGNAL PROPAGATION TIMES FOR SIGNAL WAVEFORMS

[75] Inventors: Ryuichi Yamaguchi, Osaka; Yasuhiro Tomita, Hyogo, both of Japan

[73] Assignee: Matsushita Electric Industrial Co., Ltd., Osaka, Japan

[21] Appl. No.: 08/612,330

[22] Filed: Mar. 7, 1996

[30] Foreign Application Priority Data

Mar. 9, 1995 [JP] Japan ................... 7-049574

[51] Int. Cl.$^6$ .................................................. G06F 17/50
[52] U.S. Cl. ............................................................ 364/490
[58] Field of Search ................................... 364/487, 488, 364/489, 490, 491, 578; 371/25.1

[56] References Cited

U.S. PATENT DOCUMENTS

| | | | |
|---|---|---|---|
| 5,056,094 | 10/1991 | Whetsel | 371/25.1 |
| 5,210,700 | 5/1993 | Tom | 364/489 |
| 5,293,327 | 3/1994 | Ikeda et al. | 364/578 |
| 5,345,401 | 9/1994 | Tani | 364/578 |
| 5,384,720 | 1/1995 | Ku et al. | 364/578 |
| 5,663,889 | 9/1997 | Wakita | 364/490 |

FOREIGN PATENT DOCUMENTS

1-271869   10/1989   Japan .

*Primary Examiner*—Kevin J. Teska
*Assistant Examiner*—Russell W. Frejd
*Attorney, Agent, or Firm*—McDermott, Will & Emery

[57] ABSTRACT

A signal propagation time in an integrated circuit can be calculated based on a signal delay time in each of the cells composing the integrated circuit. The signal delay time in each cell can be calculated from the load capacity of a wire connected to an output terminal of the cell and from the slew of the waveform of an input signal. To calculate the slew of the waveform of the input signal, it is required to trace back the path of the input signal. When a feedback loop exists in the integrated circuit, the process of tracing back the path of the input signal may result in an endless loop. To prevent the occurrence of the endless loop, if an input terminal for a clock signal is present in a cell having an output terminal at which a signal waveform is not calculated, the signal waveform at the output terminal is calculated based on the waveform of the clock signal. In addition, a directory in which the correspondence of the output terminal and the input terminal is recorded is produced so that the signal waveform at the output terminal can be calculated based on the signal waveform at the corresponding input terminal recorded in the directory.

7 Claims, 8 Drawing Sheets

| CELL | OUTPUT TERMINAL | INPUT TERMINAL |
|---|---|---|
| C1 | Q | CK |
| C2 | Y | A |
| C2 | Y | B |
| ⋮ | ⋮ | ⋮ |

METHOD AND APPARATUS FOR CALCULATING SLEW RATES AND SIGNAL PROPAGATION TIMES FOR SIGNAL WAVEFORMS

BACKGROUND OF THE INVENTION

The present invention relates to logic simulation of semiconductor integrated circuits. More particularly, it relates to a signal-waveform calculating method and apparatus for calculating the slew or the like of a signal waveform on the rising or falling edge in a CMOS circuit and to a signal-propagation-time calculating method and apparatus based on the signal waveform.

As higher-speed, lower-voltage operation has been required of integrated circuits in recent years, logic simulation in the design stage has increased in importance. As a result, logic simulation technology with higher accuracy has been in increasing demand.

In conventional logic simulation, a signal delay time in each cell of a semiconductor integrated circuit has been calculated in accordance with a linear expression using the load capacity of a wire connected to the cell.

As a technique for improving the accuracy of logic simulation, there has been proposed a method whereby a signal delay time in each cell of a semiconductor integrate circuit is calculated in consideration of the waveform of an input signal. An example of the calculation method is disclosed in Japanese Laid-Open Patent Publication HEI 1-271869.

A signal delay time in a cell greatly varies according to whether an input signal has a waveform with a small slew which entails a short rise or fall time or a waveform with a large slew which entails a long rise or fall time. Accordingly, in the foregoing method, the load capacity of a wire connected to an output terminal of a cell and the rise time of an input signal are calculated such that a signal delay time is calculated based on the calculated load capacity and rise time of the signal, thereby providing a value closer to an actual delay time.

A signal waveform at an input terminal of a cell of concern is influenced by a signal waveform at an output terminal of a cell in a previous stage connected to the input terminal of the cell of concern. Moreover, the signal waveform at the output terminal of the cell in the previous stage is also influenced by a waveform at an input terminal of a cell in a further previous stage.

Figures 8A, 8B:
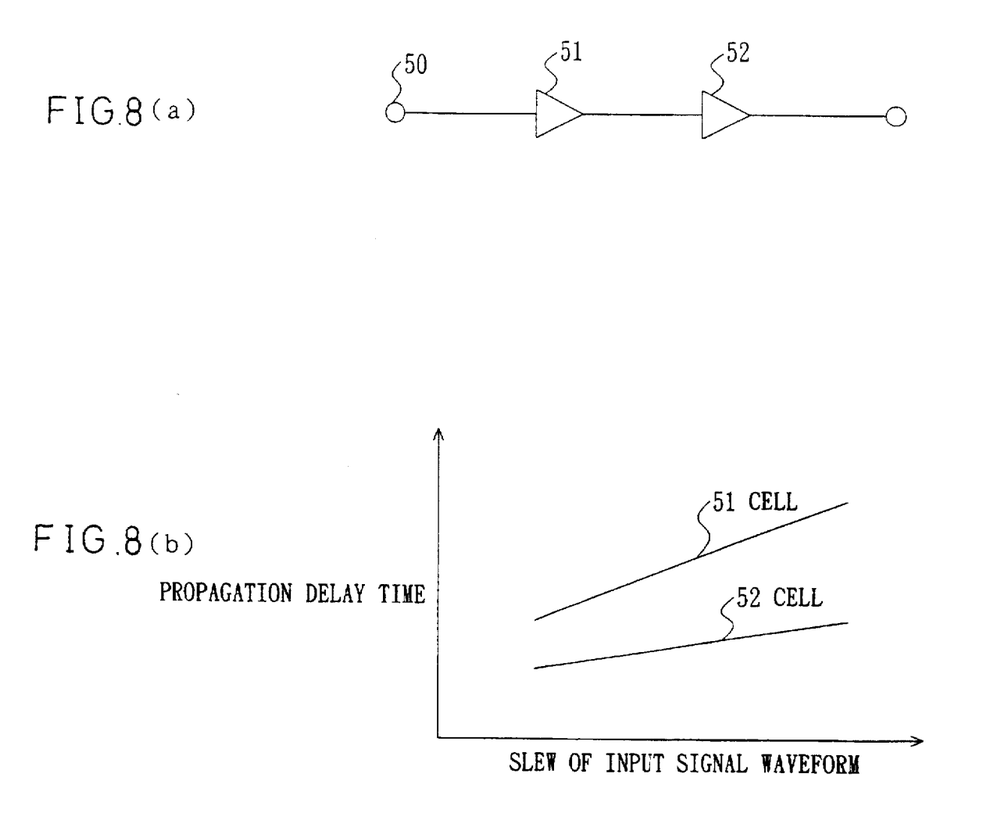
FIG. 8(a) is a circuit diagram for illustrating problems with a conventional technique.
FIG. 8(b) is a graph representing the relationship between an input signal and a delay time in each cell in the circuit diagram of FIG. 8(a).

For example, when cells 51 and 52 are connected in series as shown in FIG. 8(a), if the waveform of an input signal port 50 changes, a signal delay time in the cell 51 changes. Since a signal waveform at an output terminal of the cell 51 changes, the signal waveform at an input of the cell 52 also changes, which changes a signal delay time in a cell 52. Thus, as shown in FIG. 8(b), the respective signal delay times in the cells 51 and 52 change with the changing of the waveform of the input signal port 50. To calculate a signal delay time in each cell, therefore, it is required to trace back the path of the input signal and calculate its previous waveforms.

However, the conventional method has the following problems.

Figure 3:
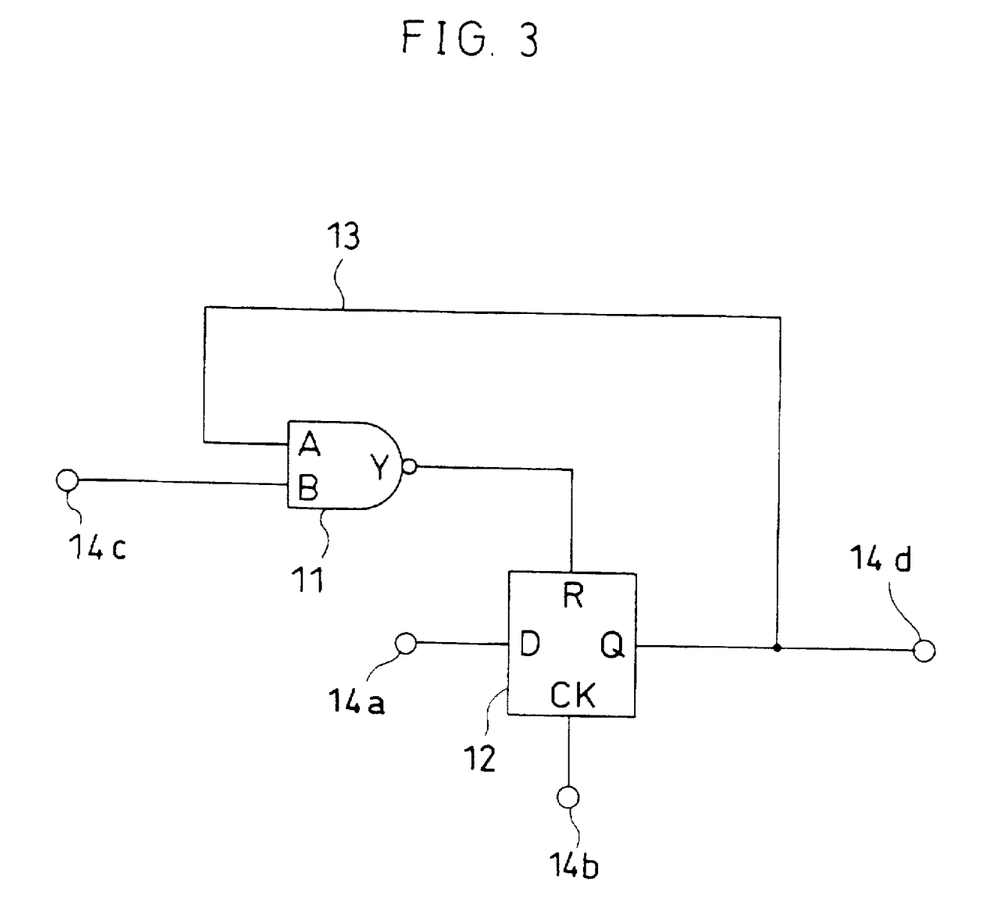
FIG. 3 is a circuit diagram showing the structure of a circuit used for illustration of a method of calculating signal waveforms according to the first embodiment and a second embodiment of the present invention.

As described above, to calculate a signal delay time in each cell, it is required to trace back the path of the input signal and calculate its previous waveforms. In this case, if the circuit is composed only of cells connected in series, there should be no problem. However, if the circuit includes a feedback loop as shown in FIG. 3, an endless loop may occur in the process of tracing back the path of the input signal and calculate its previous waveforms.

If a cell has a plurality of input terminals, on the other hand, the slews of signal waveforms at respective input terminals of the cell are generally different from each other. As a result, the slews of the signal waveforms at an output terminal of the cell are different from each other depending on the input signals that have changed the signal waveforms. In a cell having a plurality of input terminals, the slew of a signal waveform at the output terminal has conventionally been calculated by using a maximum, minimum, or mean value of the slew of signal waveforms at the input terminals. Consequently, if the waveforms are greatly different from each other depending on the input signals, the delay time cannot be calculated with accuracy. To improve the accuracy with which the delay time is calculated, there has also been proposed a method whereby a set of two delay times are calculated by using both the maximum and minimum values of the slew of a signal waveform at an input terminal of a cell. However, the method is not satisfactory since it involves an increased amount of calculation.

SUMMARY OF THE INVENTION

The present invention provides a method and apparatus for calculating signal waveforms with higher accuracy than has been previously attainable in logic simulation of a semiconductor integrated circuit, a method and apparatus for calculating different delay times in accordance with different signal paths with high accuracy in the logic simulation, and a memory medium.

Specifically, the present invention provides a method of calculating signal waveforms at respective output terminals of a plurality of cells each having a logical function and composing an integrated circuit, the above method comprising: a first step of judging whether or not one of the plurality of cells for which a signal waveform is to be calculated has an input terminal for a clock signal; and a second step of calculating, when the above cell has the input terminal for the clock signal, a signal waveform at an output terminal of the above cell based on a waveform of the above clock signal and calculating, when the above cell does not have the input terminal for the clock signal, signal waveforms at the output terminal of the above cell based on a signal waveform at each input terminal of the above cell.

By the signal-waveform calculation method, a signal waveform at an output terminal of a cell having an input terminal for a clock signal can be calculated based on the waveform of the clock signal. The path of the clock signal can positively be traced back to a clock-signal input terminal of an integrated circuit. Consequently, even when a circuit includes a feedback loop, the presence of a cell having the clock-signal input terminal eliminates the possibility of the occurrence of an endless loop in the process of tracing back the signal, resulting in the calculation of a signal waveform with improved accuracy.

Alternatively, the present invention provides a method of calculating signal waveforms at respective output terminals of a plurality of cells each having a logical function and composing an integrated circuit, the above method comprising: a first step of giving a test pattern to the integrated circuit and executing logic simulation; a second step of specifying and recording, with respect to one of the plurality of cells for which a signal waveform is to be calculated, an input terminal of the above cell which receives an input signal for changing an output signal from an output terminal of the above cell based on a result of the logic simulation executed in the above first step; and a third step of calculating a signal waveform at the output terminal of the above cell based on a signal waveform at the input terminal recorded in the above second step.

By the signal-waveform calculation method, an integrated circuit is provided with a test pattern so that logic simulation is executed. From the result of the logic simulation, the correspondence between the output terminal of each cell and an input terminal which has changed the signal waveform at the output terminal is obtained and recorded. In accordance with the recorded correspondence, a signal path for calculating the signal waveform at the output terminal of each cell is specified. Consequently, a signal waveform closer to one obtained from a circuit in actual operation can be calculated. As a result, a signal waveform can be calculated with higher accuracy than has been previously attainable.

Alternatively, the present invention provides a method of calculating a signal propagation time in an integrated circuit composed of a plurality of cells each having a logical function, the above method comprising: a first step of calculating, with respect to a first cell having a plurality of input terminals and a second cell having an input terminal connected to an output terminal of the above first cell in the integrated circuit, signal waveforms at the input terminal of the above second cell based on respective signal waveforms received by the plurality of input terminals of the above first cell; a second step of calculating delay times in the above second cell based on the plurality of signal waveforms at the input terminal of the above second cell calculated in the above first step, selecting one of the plurality of delay times in the above second cell as a provisional delay time, and calculating a time difference between the above provisional delay time and each of the other delay times; and a third step of adding the time differences calculated in the above second step to each of a plurality of delay times in the above first cell calculated based on the respective signal waveforms received by the plurality of input terminals of the above first cell.

By the signal-propagation-time calculation method, signal waveforms at an input terminal of a second cell can be calculated based on respective signal waveforms at input terminals of a first cell. Delay times in the second cell are calculated based on the respective signal waveforms at the input terminal of the second cell. One of the delay times calculated is selected as a provisional delay time and a time difference between the provisional delay time and each of the delay times is calculated. The calculated time difference is added to each of the delay times in the first cell. Consequently, the delay times in the second cell is represented by a single value and variations in delay time are represented in the form of additives to the delay times in the first cell. Consequently, different delay times in accordance with different signal paths can be represented in simple forms without the use of complicated parameters and with higher accuracy. As a result, a signal propagation time can be calculated with higher accuracy and more ease than has been previously attainable.

DETAILED DESCRIPTION OF THE INVENTION

Below, a method and apparatus for calculating signal waveforms, a method and apparatus for calculating a signal propagation time, and a memory medium according to each embodiment of the present invention will be described with reference to the drawings.

A description will be given first to the overall flow of the signal-propagation-time calculation method according to each embodiment. A signal propagation time in an integrated circuit can be calculated based on a signal delay time in each cell, which can be calculated from the load capacity of an output terminal of each cell, the resistance of a wire connected to the output terminal, and the slew of a waveform of an input signal.

Figure 1:
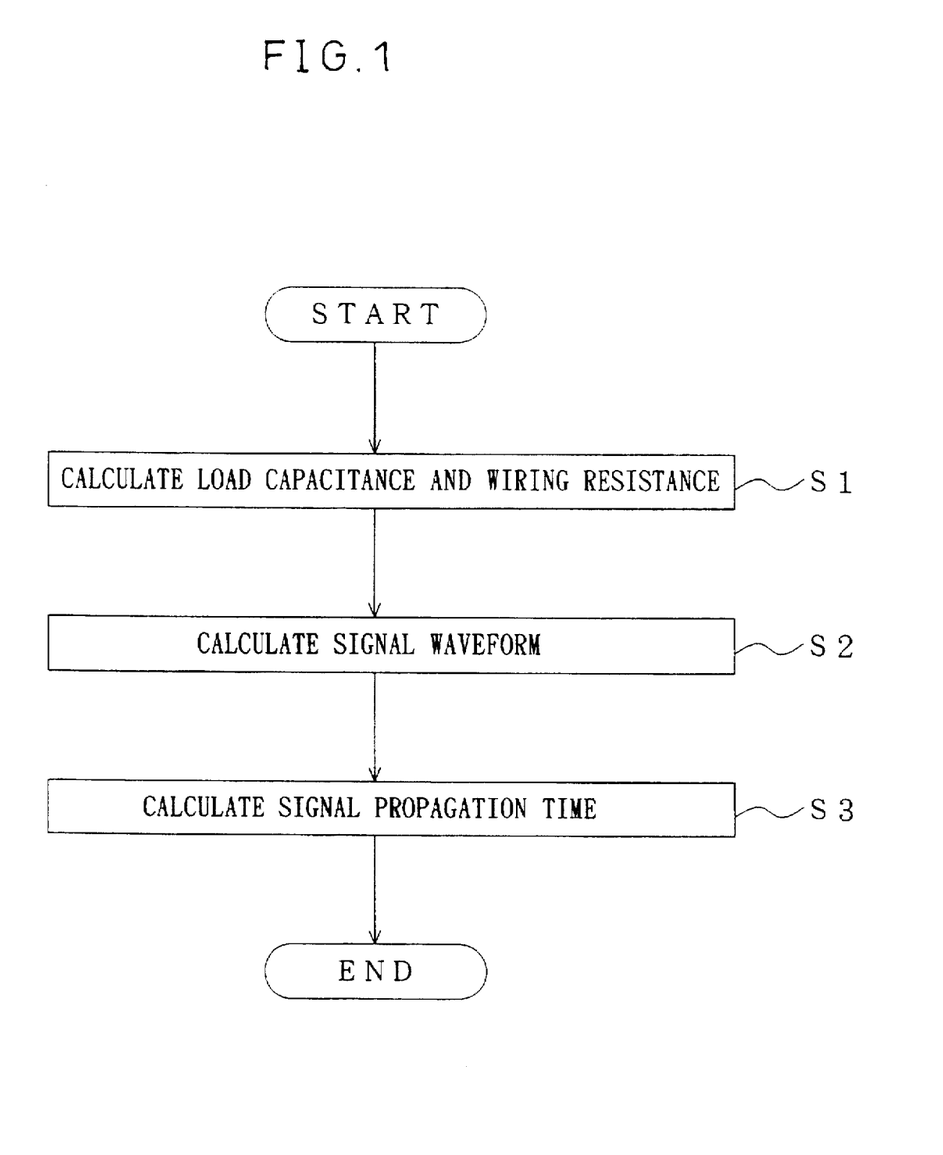
FIG. 1 is a flow chart showing the flow of a method of calculating a signal propagation time according to each embodiment of the present invention.

FIG. 1 is a flow chart showing the overall flow of the method of calculating a signal propagation time according to each embodiment. In step S1, the load capacitance connected to the output terminal of each cell and the resistance of the wire connected to the output terminal are calculated. Then, in step S2, the slew of the waveform of an input signal to an input terminal of each cell is calculated. Finally, in step S3, the signal delay time in each cell is calculated from the load capacitance and wiring resistance calculated in step S1 and from the slew of the signal waveform calculated in step S2. The signal delay time in the integrated circuit is calculated based on the signal delay time in each cell thus calculated.

(First Embodiment)

A first embodiment of the present invention is characterized by step S2 in the method of calculating a signal propagation time shown in FIG. 1.

Figure 2:
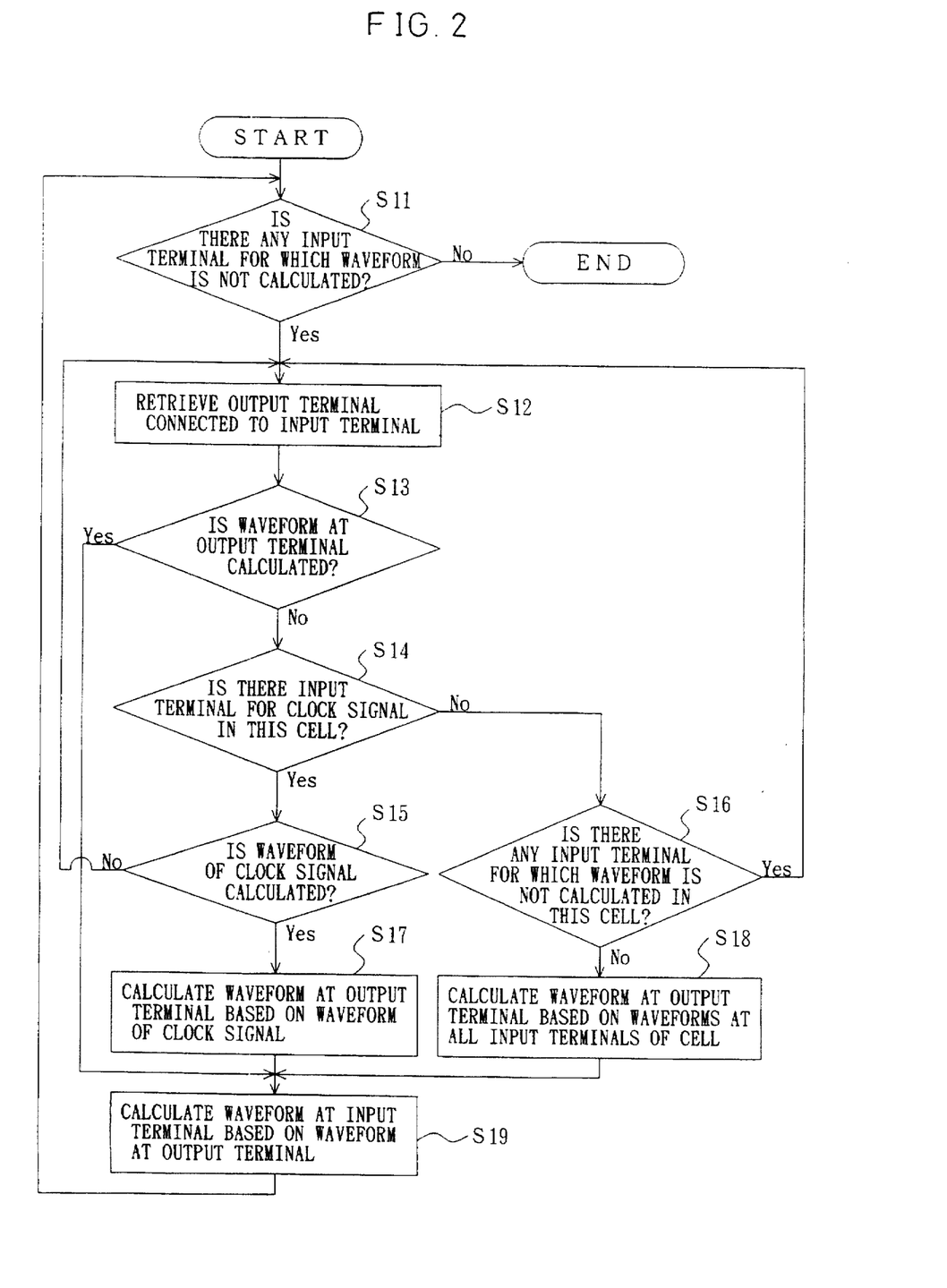
FIG. 2 is a flow chart showing the flow of a method of calculating signal waveforms according to a first embodiment of the present invention.

FIG. 2 is a flow chart representing the flow of the method of calculating signal waveforms according to the present embodiment, which is one of the methods to be used in step S2 of the method of calculating a signal propagation time shown in FIG. 1. Referring now to FIG. 2, a description will be given to the flow of the method of calculating signal waveforms according to the present embodiment.

First, in step S11, it is judged whether or not a given circuit has any input terminal at which a signal waveform is not calculated. If a signal waveform is calculated at each input terminal, the process is completed. If there is an input terminal at which a signal waveform is not calculated, an output terminal connected to the input terminal is retrieved in step S12. In step S13, it is judged whether or not a signal waveform at the retrieved output terminal is calculated. If it is calculated, the process goes on to step S19 where the signal waveform at the input terminal is calculated based on the signal waveform at the output terminal and returns to step S11. If the signal waveform at the retrieved output terminal is not calculated, the process goes on to step S14.

In step S14, it is judged whether or not a cell having the output terminal has an input terminal for a clock signal. If the cell has an input terminal for a clock signal, it is judged in step S15 whether or not the waveform of the clock signal is calculated. If the waveform of the clock signal is not calculated, the process returns to step S12 where the path of the clock signal is traced back and its previous waveforms are calculated. If the waveform of the clock signal is calculated, the signal waveform at the output terminal of the cell is calculated in step S17 based on the calculated waveform of the clock signal. Subsequently, the process goes on to step S19 where the signal waveform at the input terminal is calculated based on the signal waveform at the output terminal and returns to step S11.

If it is judged in step S14 that the cell has no input terminal for a clock signal, it is judged in step S16 whether or not the cell has any input terminal at which a signal waveform is not calculated. If there is an input terminal at which a signal waveform is not calculated, the process returns to step S12. If a signal waveform is calculated at each input terminal, the signal waveform at the output terminal is calculated based on the signal waveform at each input terminal in step S18. In this case, different values in accordance with different signal waveforms at respective input terminals are calculated for the slew of the signal waveform at the output terminal, so that a mean value, maximum value, or minimum value thereof is selected to be defined as the slew of the signal waveform at the output terminal. The process then goes on to step S19 where the signal waveform at the input terminal is calculated based on the signal waveform at the output terminal and returns to step S11.

FIG. 3 is a circuit diagram for illustrating an example of calculation in accordance with the method of calculating signal waveforms according to the present embodiment. In FIG. 3 are shown: a NAND gate 11 as a cell; a D flip-flop 12 as a cell; a feedback loop line 13; an input terminal 14a for receiving a signal from the external circuit; an input terminal 14b for receiving a clock signal from the external circuit; a reset-signal input terminal 14c for receiving a reset signal from the outside; and an output terminal 14d for outputting a signal to the external circuit. The NAND gate 11 has input terminals A and B and an output terminal Y. The D flip-flow 12 has an input terminal D, an output terminal Q, a clock-signal input terminal CK, and a reset terminal R. The output terminal Q of the D flip-flop 12 is connected to the input terminal A of the NAND gate 11 via the feedback loop line 13. The output terminal Y of the NAND gate 11 is connected to the reset terminal R of the D flip-flop 12 so that, when each of the input signals to the NAND gate 11 is on the HIGH level, the output signal therefrom is on the LOW level, thereby resetting the D flip-flop 12.

A specific description will be given to the method of calculating signal waveforms according to the present embodiment by mainly referring to FIG. 3. In the circuit diagram shown in FIG. 3, it is assumed that a signal waveform has already been calculated at each of the input terminal 14a, clock-signal input terminal 14b, and reset-signal input terminal 14c, while a signal waveform has not been calculated yet at the input terminals A, B, and D and at the output terminals Y and Q.

First, it is assumed that the input terminal A is selected as an input terminal at which a signal waveform is calculated. The output terminal Q is retrieved along the feedback loop line 13 connected to the input terminal A. Since the signal waveform is not calculated at the output terminal Q, it is judged whether or not the D flip-flop 12 has an input terminal for a clock signal. Since the clock-signal input terminal CK exists, the signal waveform at the clock-signal input terminal CK is calculated based on the signal waveform at the clock-signal input terminal 14b, so that the signal waveform at the output terminal Q is calculated based on the signal waveform at the clock-signal input terminal CK. The signal waveform at the input terminal A is then calculated based on the signal waveform at the output terminal Q.

Next, it is assumed that the input terminal B is selected as an input terminal at which a signal waveform is not calculated. The signal waveform at the input terminal B is calculated based on the signal waveform at the input terminal 14a.

Finally, the reset terminal R is selected as an input terminal at which a signal waveform is not calculated. The output terminal Y is retrieved as an output terminal connected to the reset terminal R. Since the signal waveform is not calculated at the output terminal Y, it is judged whether or not the NAND gate 11 has an input terminal for a clock signal. Since the NAND gate 11 has no input terminal for a clock signal, it is subsequently judged whether or not there is any input terminal at which a signal waveform is not calculated. Since the signal waveform has already been calculated at each of the input terminals A and B, the signal waveform at the output terminal Y is calculated based on the signal waveforms at the input terminals A and B. The signal waveform at the reset terminal D is calculated based on the signal waveform at the output terminal Y. In this manner, the signal waveform at each of the input terminals is calculated.

In the conventional method, since the calculation of the signal waveform at the output terminal Q requires the calculation of the signal waveform at the input terminal D, the calculation of the signal waveform at the input terminal D requires the calculation of the signal waveform at the output terminal Y, the calculation of the signal waveform at the output terminal Y requires the calculation of the signal waveform at the input terminal A, and the calculation of the signal waveform at the input terminal A requires the calculation of the signal waveform at the output terminal Q, an endless loop eventually occurs in the calculation process.

In the present embodiment, however, since the signal waveform at the output terminal Q of the D flip-flop 12 is calculated based on the signal waveform at the input terminal CK for a clock signal, an endless loop does not occur in the calculation process.

Thus, by the method of calculating signal waveforms according to the first embodiment of the present invention, an endless loop does not occur even in a circuit including a feedback loop line, which enables the tracing back of the path of a signal and calculation of its previous waveforms.

(Second Embodiment)

A second embodiment of the present invention is also characterized by step S2 in the method of calculating a signal propagation time shown in FIG. 1.

Figure 4:
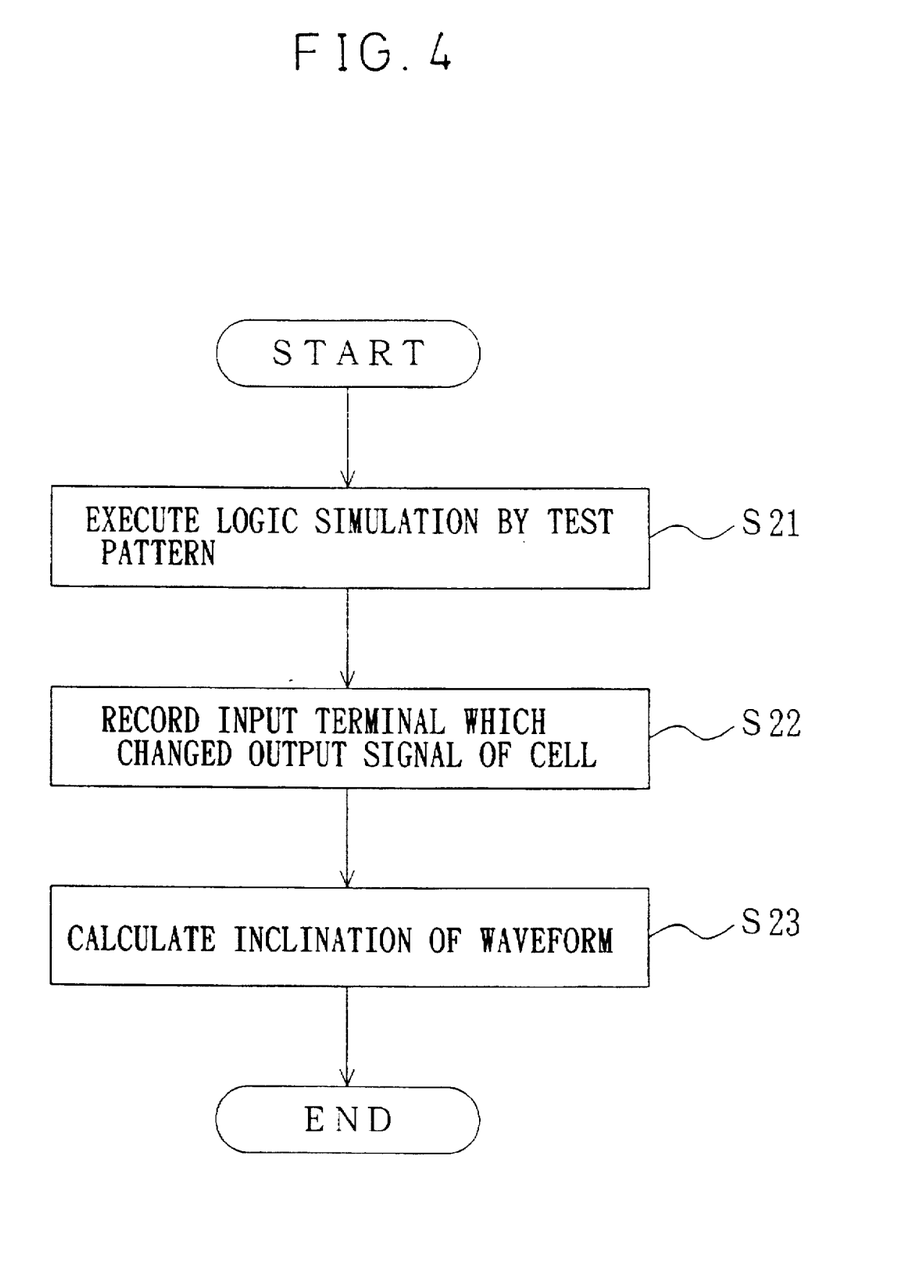
FIG. 4 is a flow chart showing the flow of the method of calculating signal waveforms according to the second embodiment.

FIG. 4 is a flow chart showing the flow of a method of calculating signal waveforms according to the second embodiment of the present invention, which is also one of the methods to be used in step S2 of the method of calculating a signal propagation time shown in FIG. 1. Referring now to FIG. 4, a description will be given to the flow of the method of calculating signal waveforms according to the present embodiment.

First, in step S21, a test pattern is inputted to a given circuit and logic simulation is executed. Then, in step S22, an input terminal which has changed a signal waveform at each output terminal is retrieved from the result of the logic simulation executed in step S22 and the correspondence between the output terminal and the input terminal is recorded in a directory. Finally, in step S23, the signal waveform at each output terminal is calculated based on the signal waveform at the corresponding input terminal recorded in the directory.

Figure 5:
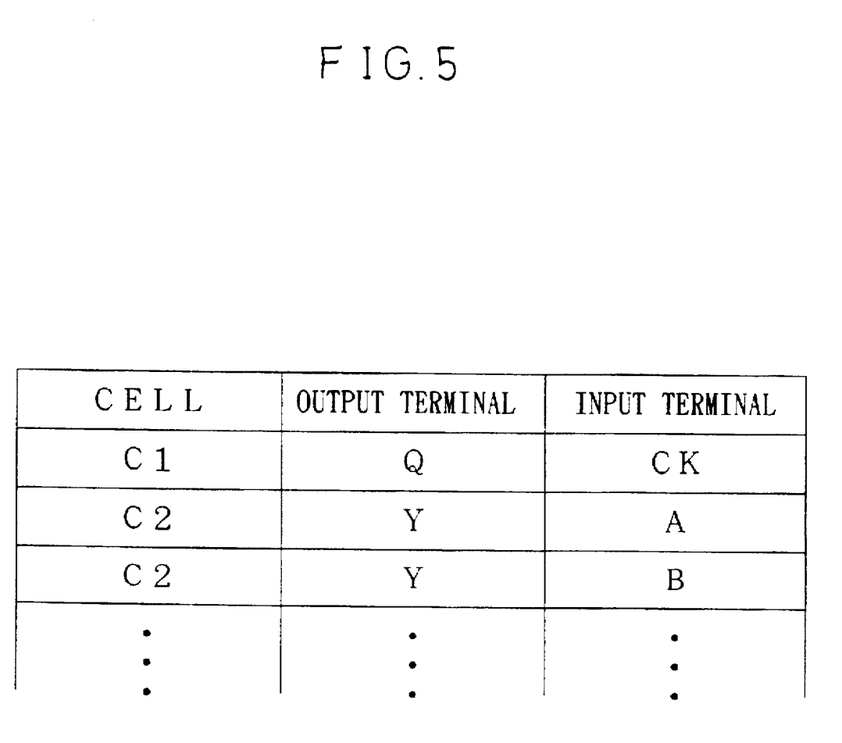
FIG. 5 is an example of a directory representing the correspondences between output terminals and input terminals, which is produced in the second embodiment of the present invention.

FIG. 5 shows a part of a directory that has been produced based on the result of logic simulation executed with respect to the circuit of FIG. 3 in the present embodiment. A cell C1 corresponds to the D flip-flop 12 and a cell C2 corresponds to the NAND gate 11.

In the cell C1 or D flip-flop 12, a signal at the output terminal Q changes on the rising edge of a clock signal. Consequently, after the execution of the logic simulation, the output terminal Q and the clock terminal CK are recorded in the directory. Likewise, in the cell C2 or NAND gate 11, a signal at the output terminal Y is changed by signals at the input terminals A and B. Consequently, the output terminal Y and the input terminal A are recorded in the directory, while the output terminal Y and the input terminal B are recorded therein.

In step S23, the path of the signal is traced back and its previous waveforms are calculated in accordance with the correspondences between the output terminals and input terminals recorded in the directory. For example, to calculate the signal waveform at the output terminal Q of the D flip-flop 12, the path of the signal is traced back from the clock terminal CK toward the clock-signal input terminal 14b. Accordingly, even when the circuit includes a feedback loop, an endless loop does not occur in the calculation process.

Thus, by the method of calculating signal waveforms according to the second embodiment of the present invention, the signal waveform at each output terminal can be calculated along a signal path compliant with actual changes of the signal. By using the signal waveform, therefore, a signal delay time closer to one obtained from the circuit in actual operation can be calculated with high accuracy.

(Third Embodiment)

A third embodiment of the present invention is characterized by step S3 in the method of calculating a signal propagation time shown in FIG. 1.

Figure 6:
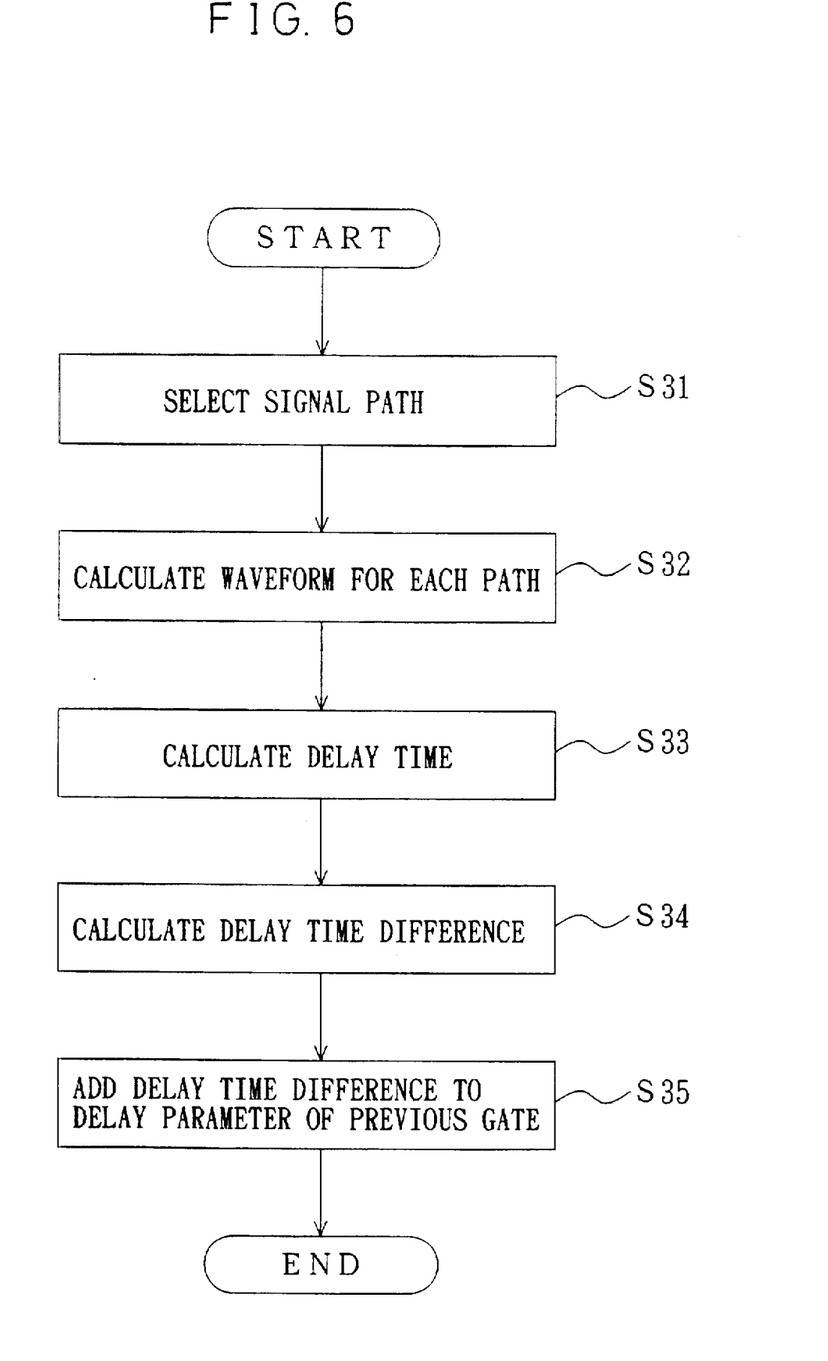
FIG. 6 is a flow chart representing the flow of a method of calculating a signal propagation time according to a third embodiment of the present invention.

FIG. 6 is a flow chart showing the flow of a delay-time calculation method used in the method of calculating a signal propagation time according to the present embodiment, which is one of the methods to be used in step S3 of the method of calculating a signal propagation time shown in FIG. 1.

Referring now to FIG. 6, a description will be given to the flow of the delay-time calculation method according to the present embodiment.

First, in step S31, a signal path connecting an output terminal of a cell having a plurality of input terminals to an input terminal of another cell is selected.

Figure 7:
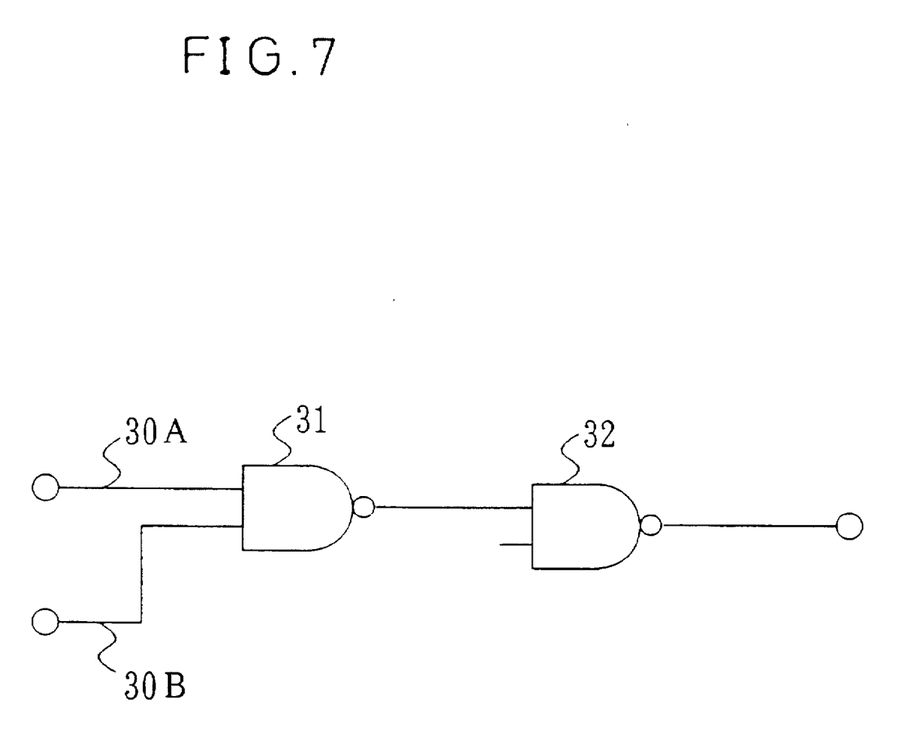
FIG. 7 is a circuit diagram for illustrating the method of calculating a signal propagation time according to the third embodiment of the present invention.

FIG. 7 is a circuit diagram showing an example of the signal path selected in step S31, in which are shown: wires 30A and 30B; and cells 31 and 32.

Then, in step S32, signal waveforms at an output terminal of the cell 31 and at an input terminal of the cell 32 are calculated. In either case, a set of two signal waveforms are calculated based on the signal waveform via the wire 30A and on the signal waveform via the wire 30B.

In step S33, a delay time in the cell 32 is calculated. Since two types of signal waveforms have been given to the input terminal of the cell 32, two types of delay times can be calculated. It is assumed here that the delay time in the cell 32 calculated based on the signal waveform via the wire 30A is designated at $T_1$ and the delay time in the cell 32 calculated based on the signal waveform via the wire 30B is designated at $T_2$.

In step S34, a provisional delay time in the cell 32 is defined as $T_1$, while a delay time difference $\Delta T$ ($=T_2-T_1$) is calculated.

Finally, in step S35, the delay time difference $\Delta T$ is added to delay times in the cell 31 in the previous stage. It is assumed that a delay time in the cell 31 calculated based on the signal waveform via the wire 30A is designated at $A_0$ and a delay time in the cell 31 calculated based on the signal waveform via the wire 30B is designated at $B_0$. By addition of the delay time difference $\Delta T$ to $B_0$, $A_1$ ($=A_0$) and $B_1$ ($=B_0+\Delta T$) are obtained as updated delay times in the cell 31.

In this case, the sum of the delay times in the cells 31 and 32 calculated by the neglect of wiring delay becomes $A_1+T_1=A_0+T_1$ via the wire 30A and becomes $B_1+T_1=(B_0+\Delta T)+T_1=B_0+(T_1+\Delta T)=B_0+T_2$ via the wire 30B, which coincide with a real delay time.

In this manner, variations in delay time in the cell 32 can be represented by using the delay times in the cell 31 as parameters. Consequently, according to the present embodiment, delay times in accordance with respective paths can be represented accurately in simple forms without increase in parameter.

Although the delay times in the cell 31 have been corrected in the present embodiment in order to simply represent variations in delay time in the cell 32, the variations in delay time in the cell 32 may be represented by correcting delay times in the wires 30A and 30B.

It is possible to implement the first and third embodiments in combination, though the description of a specific embodiment thereof is omitted here. It is also possible to implement the second and third embodiments in combination.

The method of calculating signal waveforms and the method of calculating a signal propagation time according to each embodiment of the present invention can be implemented by such hardware as a CPU, an input/output device, or a logic simulator having a storage device. For example, a program for implementing the methods according to each embodiment of the present invention is preliminarily given to hardware and information on a circuit logically designed is inputted via an input device for calculation of each signal waveform and signal propagation time in the circuit.

We claim:

1. A method of calculating a signal propagation time in an integrated circuit composed of a plurality of cells each having a logical function, said method comprising:

a first step of calculating, with respect to a first cell having a plurality of input terminals and a second cell having an input terminal connected to an output terminal of said first cell in the integrated circuit, slews of signal waveforms at the input terminal of said second cell based on slews of respective signal waveforms received by the plurality of input terminals of said first cell;

a second step of calculating delay times in said second cell based on the slews of the signal waveforms at the input terminal of said second cell calculated in said first step, selecting one of the plurality of delay times in said second cell as a provisional delay time, and calculating a time difference between said provisional delay time and each of the other delay times; and a third step of adding the time difference calculated in said second step to each of a plurality of delay times in said first cell calculated based on the slews of the respective signal waveforms received by the plurality of input terminals of said first cell.

2. A method of calculating a signal propagation time according to claim 1, wherein said first cell has first and second input terminals and said first step comprises the step of calculating a slew of a first signal waveform at the input terminal of said second cell based on a slew of a signal waveform at said first input terminal, while calculating a slew of a second signal waveform at the input terminal of said second cell based on a slew of a signal waveform at said second input terminal.

3. A method of calculating a signal propagation time according to claim 2, wherein said second step comprises the steps of:

calculating a first delay time in said second cell based on the slew of said first signal waveform, while calculating a second delay time in said second cell based on the slew of said second signal waveform and defining said first delay time as the provisional delay time in said second cell, while calculating a time difference between said first delay time and said second delay time.

4. A method of calculating a signal propagation time according to claim 3, wherein said third step comprises the step of adding said time difference to the delay time in said first cell calculated based on the slew of the signal waveform at said second input terminal.

5. A method of calculating a signal propagation time in an integrated circuit composed of a plurality of cells each having a logical function, said method comprising:

a first step of judging, with respect to a first cell having a plurality of input terminals and a second cell having an input terminal connected to an output terminal of said first cell in the integrated circuit, whether or not said first cell has an input terminal for a clock signal; and a second step of, when it is judged in said first step that said first cell has the input terminal for the clock signal, calculating a slew of a signal waveform at the output terminal of said first cell based on a slew of a waveform of said clock signal and calculating a slew of a signal waveform at the input terminal of said second cell based on the calculated slew of the signal waveform at the output terminal of said first cell, and calculating a delay time in said second cell based on the slew of the signal waveform at the input terminal of said second cell, and, when it is judged in said first step that said first cell does not have the input terminal for the clock signal, calculating slews of signal waveforms at the output terminal of said first cell based on slews of respective signal waveforms received by the plurality of input terminals of said first cell and calculating slews of signal waveforms at the input terminal of said second cell based on the slews of the signal waveforms at the output terminal of said first cell, and calculating a plurality of delay times in said second cell based on the slews of the signal waveforms at the input terminal of said second cell, selecting one of the plurality of delay times in said second cell as a provisional delay time, and calculating a time difference between said provisional delay time and each of the other delay times, and adding the time difference to each of a plurality of delay times in said first cell calculated based on the slews of the respective signal waveforms received by the plurality of input terminals of said first cell.

6. An apparatus for calculating a signal propagation time in an integrated circuit composed of a plurality of cells each having a logical function, said apparatus comprising:

input means for receiving information on the integrated circuit;

a central processing unit for performing, using the information received by said input means, a first step of calculating, with respect to a first cell having a plurality of input terminals and a second cell having an input terminal connected to an output terminal of said first cell, slews of signal waveforms at the input terminal of said second cell based on slews of respective signal waveforms received by the plurality of input terminals of said first cell;

a second step of calculating a plurality of delay times in said second cell based on the slews of the signal waveforms at the input terminal of said second cell calculated in said first step, selecting one of the plurality of delay times in said second cell as a provisional delay time, and calculating a time difference between said provisional delay time and each of the other delay times; and a third step of adding the time difference calculated in said second step to each of a plurality of delay times in said first cell calculated based on the slews of the respective signal waveforms received by the plurality of input terminals of said first cell; and output means for outputting a signal delay time in said integrated circuit calculated by said central processing unit.

7. A memory medium for causing a computer to calculate a signal propagation time in an integrated circuit composed of a plurality of cells each having a logical function, said memory medium storing a program for causing the computer to execute:

a first step of calculating, with respect to a first cell having a plurality of input terminals and a second cell having an input terminal connected to an output terminal of said first cell in the integrated circuit, slews of signal waveforms at the input terminal of said second cell based on slews of respective signal waveforms received by the plurality of input terminals of said first cell;

a second step of calculating a plurality of delay times in said second cell based on the slews of the signal waveforms at the input terminal of said second cell calculated in said first step, selecting one of the plurality of delay times in said second cell as a provisional delay time, and calculating a time difference between said provisional delay time and each of the other delay times; and a third step of adding the time difference calculated in said second step to each of a plurality of delay times in said first cell calculated based on the slews of the respective signal waveforms received by the plurality of input terminals of said first cell.

* * * * *